(12) United States Patent
Liao

(10) Patent No.: US 7,798,856 B2
(45) Date of Patent: Sep. 21, 2010

(54) IC SOCKET HAVING POSITIONING MEANS FOR PICK-UP CAP

(75) Inventor: Fang-Jwu Liao, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/436,148

(22) Filed: May 6, 2009

(65) Prior Publication Data

US 2010/0136834 A1 Jun. 3, 2010

(30) Foreign Application Priority Data

Dec. 3, 2008 (CN) .............................. 97 2 21615

(51) Int. Cl.
*H01R 13/66* (2006.01)
(52) U.S. Cl. .................................................. 439/620.2
(58) Field of Classification Search ............. 439/620.2, 439/70–73, 567, 330–331, 76.1, 135
See application file for complete search history.

(56) References Cited

U.S. PATENT DOCUMENTS 6,244,875 B1 *   6/2001  McHugh et al. .............. 439/73
6,905,353 B2     6/2005  Ma et al.
7,517,228 B2 *   4/2009  Baskaran et al. ............. 439/67
7,527,507 B2 *   5/2009  Liao et al. .................... 439/135
2003/0124882 A1* 7/2003  Lai .............................. 439/73
2005/0287837 A1* 12/2005 Trobough ..................... 439/71
2008/0146045 A1* 6/2008  Chang ......................... 439/41

* cited by examiner

*Primary Examiner*—Jean F Duverne
(74) *Attorney, Agent, or Firm*—Andrew C. Cheng; Wei Te Chung; Ming Chieh Chang

(57) ABSTRACT

An IC socket (1) for receiving an IC package includes a socket body (2), a plurality of contacts (3) received in the socket body (2), and a pick-up cap (4) mounted upon the socket body (2). The socket body (2) has a base section (20) and a plurality of side walls (21) extending upward from the base section (20). At least one side wall (21) defines a top surface (212), an inner surface (210), an outer surface (211) and a pair of datum projections (2100) extending inwardly from the inner surface (210). The side wall (21) with the datum projections (2100) includes a carrying surface (213) and an inclined surface (214) which are formed by excavating the top surface (212). The carrying surface (213) is lower than the top surface (212) for engaging with a carrying portion (400) formed on the pick-up cap (4). The inclined surface (214) is away from the datum projection (2100) with a selected distance therebetween.

10 Claims, 7 Drawing Sheets

IC SOCKET HAVING POSITIONING MEANS FOR PICK-UP CAP

FIELD OF THE INVENTION

The present invention relates to an IC socket, and more particularly to an IC socket having positioning means for a pick-up cap.

DESCRIPTION OF PRIOR ART

A typical IC socket assembly for connecting an IC package to a circuit board is configured at least by a socket body mounted with a plurality of conductive terminals. The IC socket is placed onto the circuit board by a pick-and-place device, in the meantime, ensure each of the conductive terminals align with corresponding holes or solder pads on the circuit board, and then solder the IC socket onto the circuit board. Generally, there is no flat surface with sufficient area on the socket for landing of a vacuum nozzle of a pick-and-place device, in such a manner, a pick-up cap with sufficient flat surface arranged on the socket is additionally added. However, conventional pick-up caps frequently fail to achieve precise positioning when it is mounted to the socket body, which may finally cause damaging to the pick-up cap or the socket.

Thus, there is a need to provide a new IC socket that overcomes the above-mentioned problems.

SUMMARY OF THE INVENTION

It is therefore the object of the present invention to provide an IC socket having an improved pick-up cap capable of achieving fine positioning effect when it is mounted to the a socket body.

In accordance with the present invention, an IC socket for receiving an IC package includes a socket body, a plurality of contacts received in the socket body, and a pick-up cap mounted upon the socket body. The socket body has a base section and a plurality of side walls extending upward from the base section. At least one side wall defines a top surface, an inner surface, an outer surface and a pair of datum projections extending inwardly from the inner surface. The side wall with the datum projections includes a carrying surface and an inclined surface which are formed by excavating the top surface. The carrying surface is lower than the top surface for engaging with a carrying portion formed on the pick-up cap. The inclined surface is away from the datum projection with a selected distance therebetween.

BRIEF DESCRIPTION OF THE DRAWINGS

Other objects, advantages and novel features of the present invention will become more apparent from the following detailed description when taken in conjunction with the accompanying drawings, in which.

DETAILED DESCRIPTION OF PREFERRED EMBODIMENT

Figure 1:
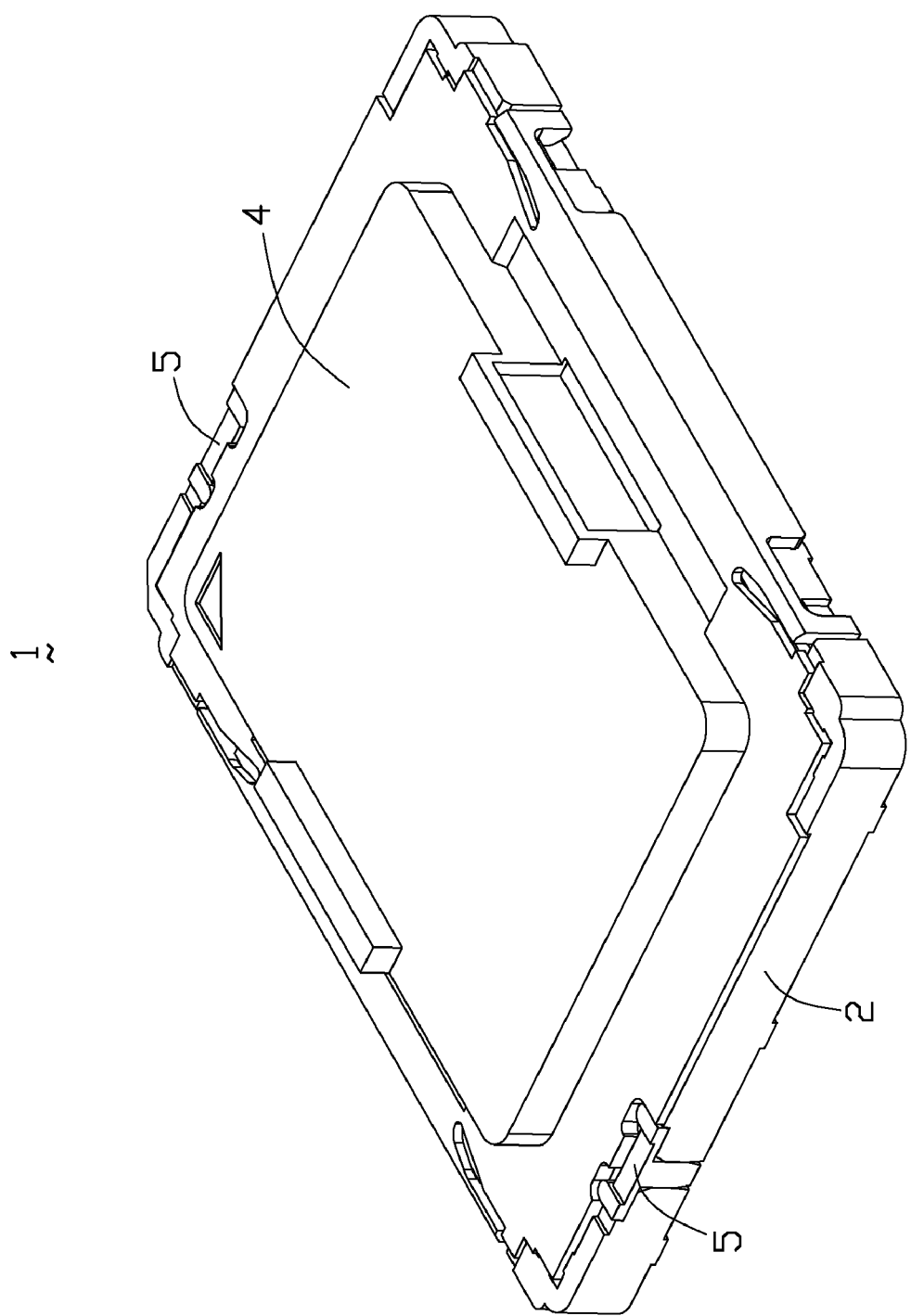
FIG. 1 is an assembled, perspective view of an IC socket in accordance with a preferred embodiment of the present invention.
Figure 2:
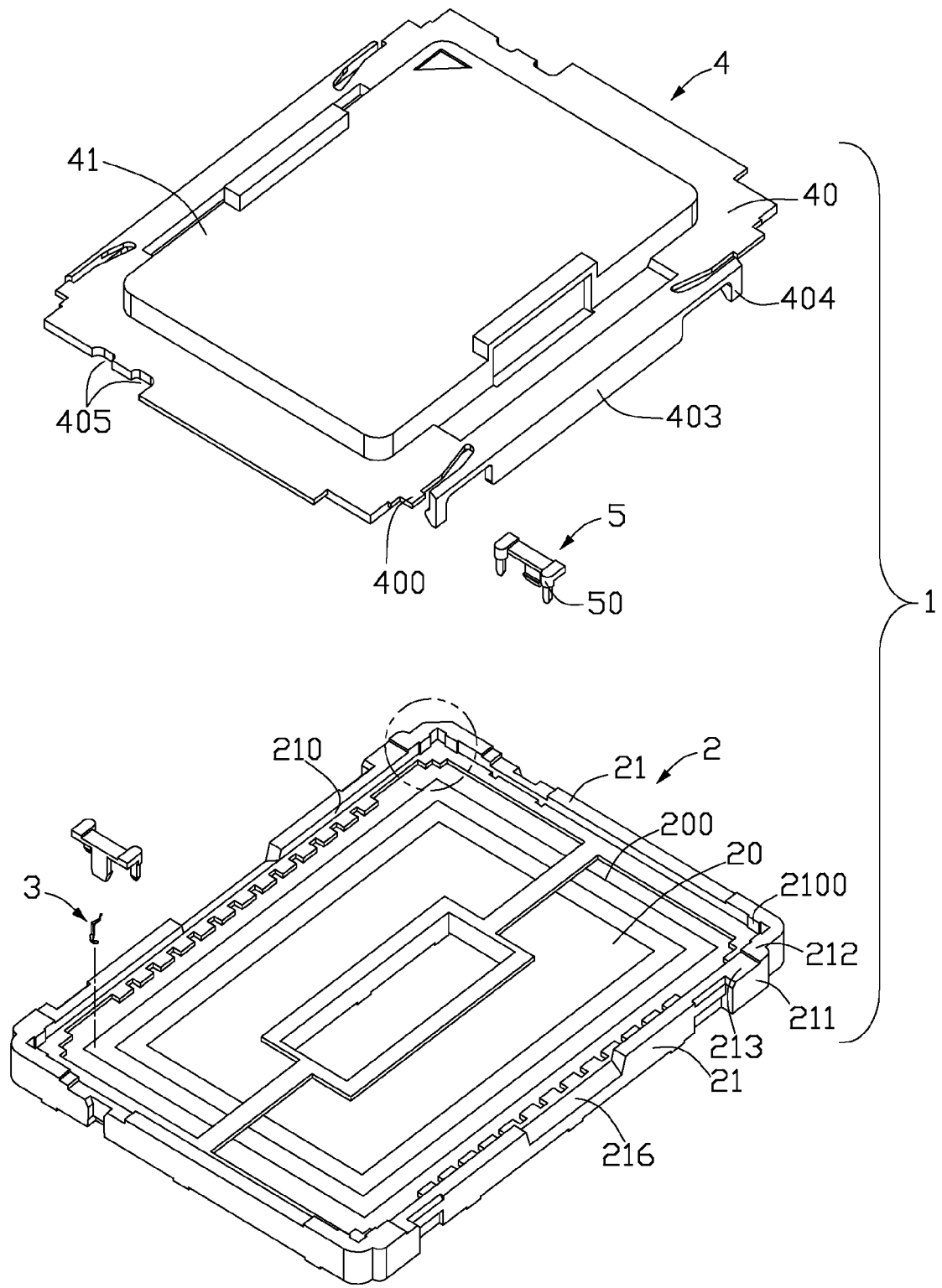
FIG. 2 is an exploded, perspective view of FIG. 1.

Referring to FIG. 1 and FIG. 2, an IC socket 1 made in accordance with a preferred embodiment of the present invention includes a socket body 2, a plurality of contact 3 received in the socket body 2, and a pick-up cap 4 mounted upon the socket body 2.

Figure 3:
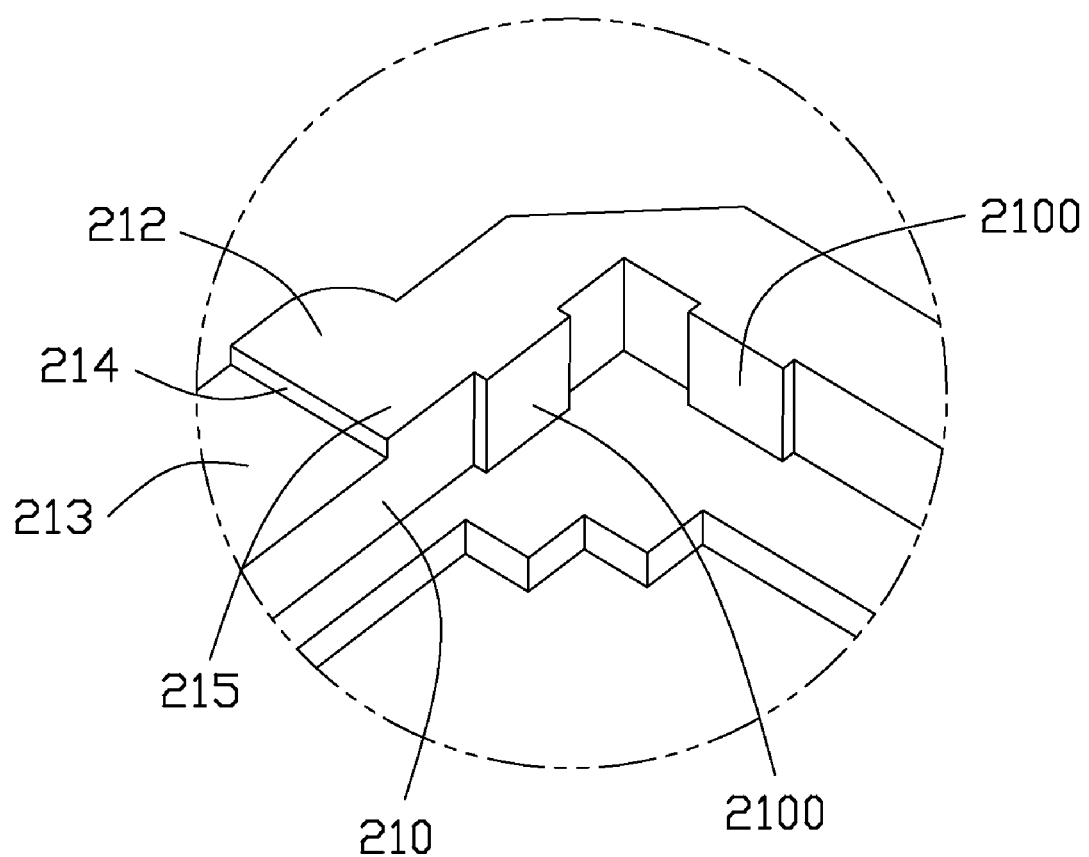
FIG. 3 is an enlarged view of a portion marked by a circle in FIG. 2.
Figure 4:
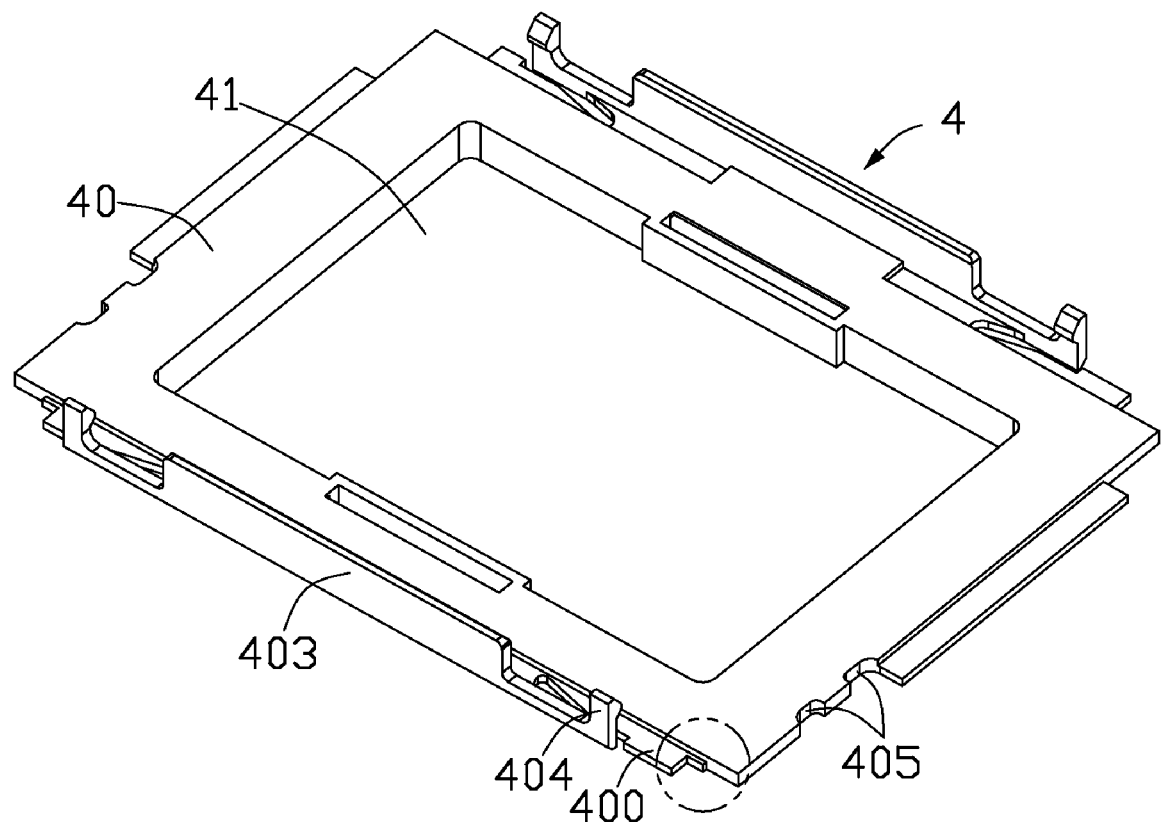
FIG. 4 is a perspective view of a pick-up cap of the IC socket in accordance with the preferred embodiment of the present invention.
Figure 5:
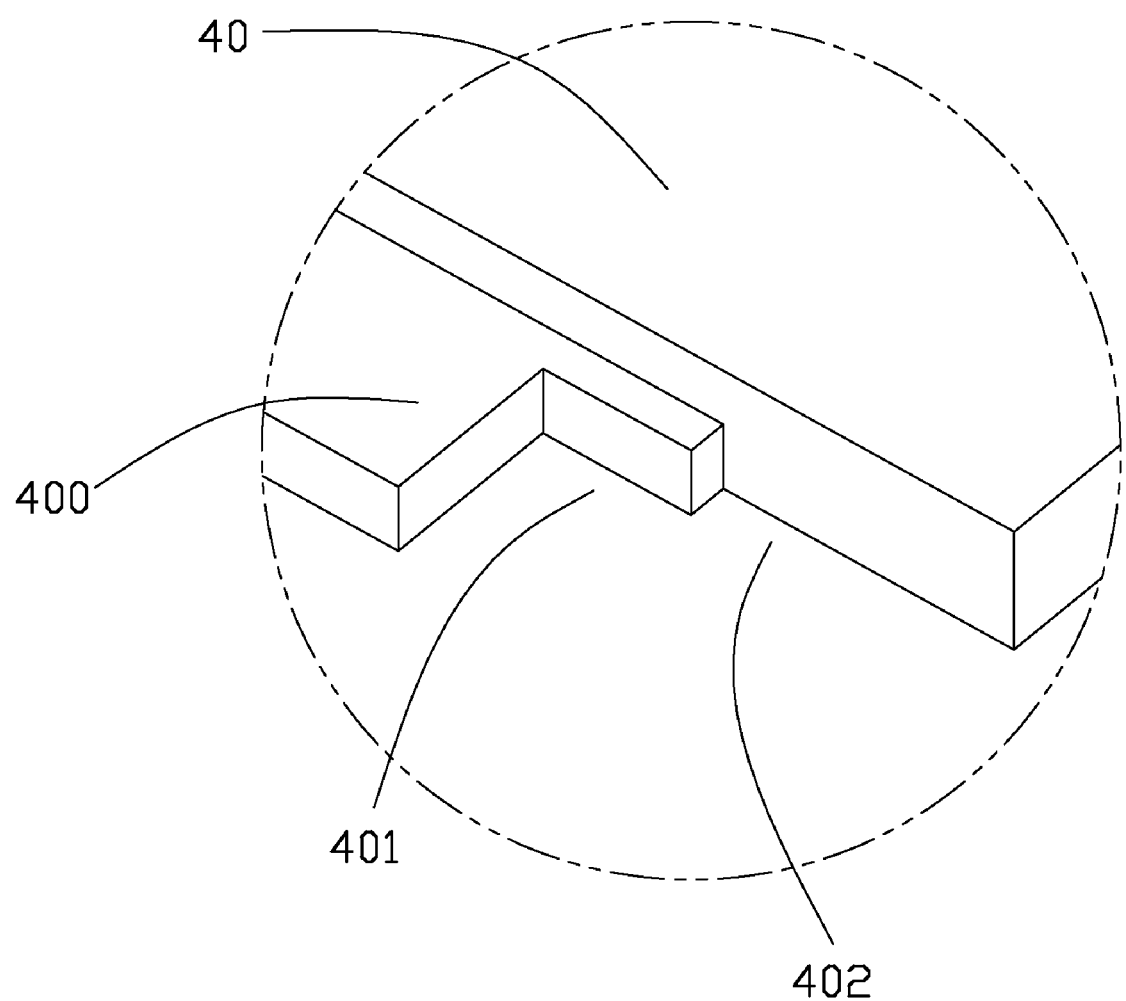
FIG. 5 is an enlarged view of a portion marked by a circle in FIG. 4.
Figure 6:
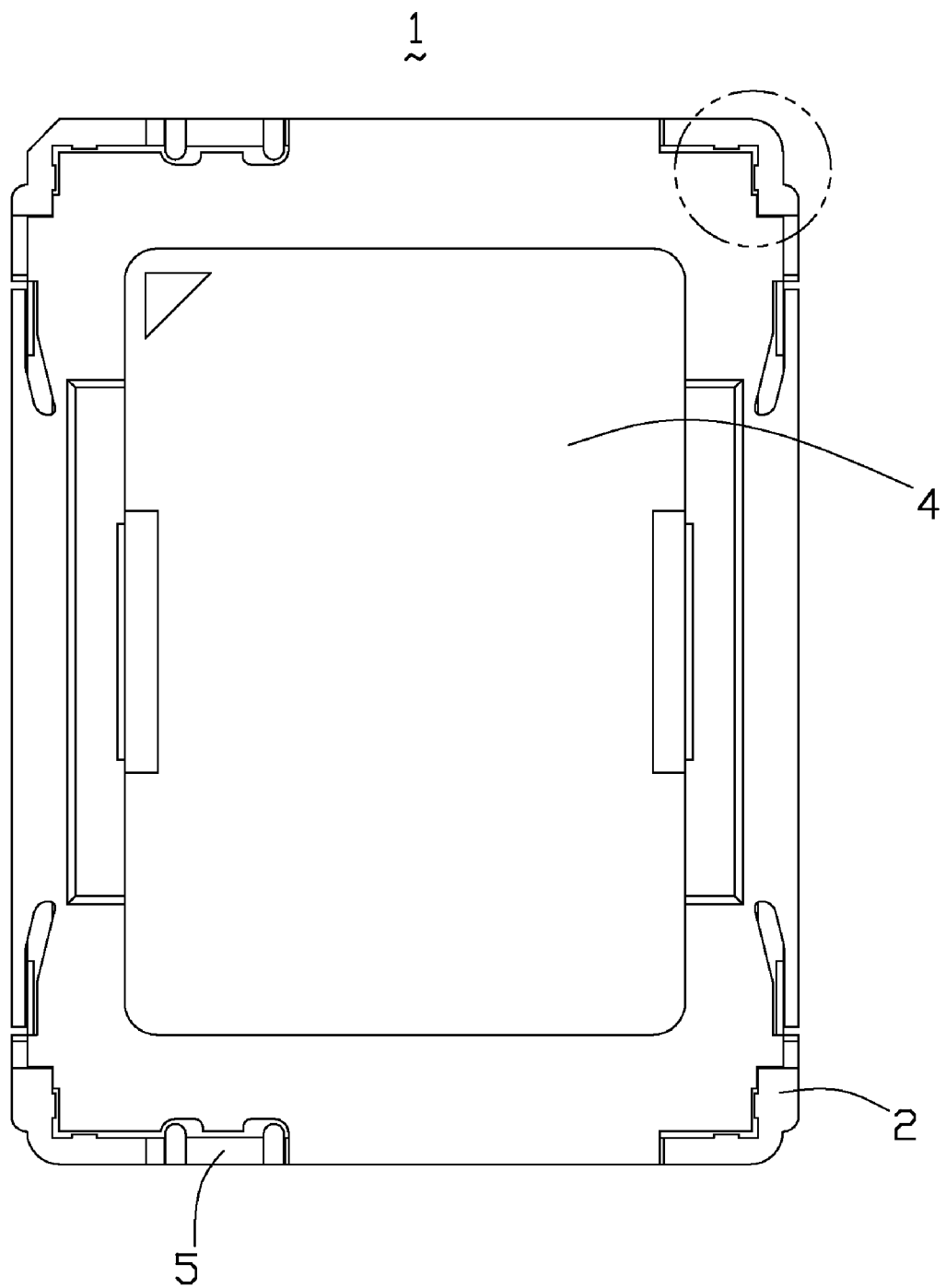
FIG. 6 is a top view of FIG. 1.
Figure 7:
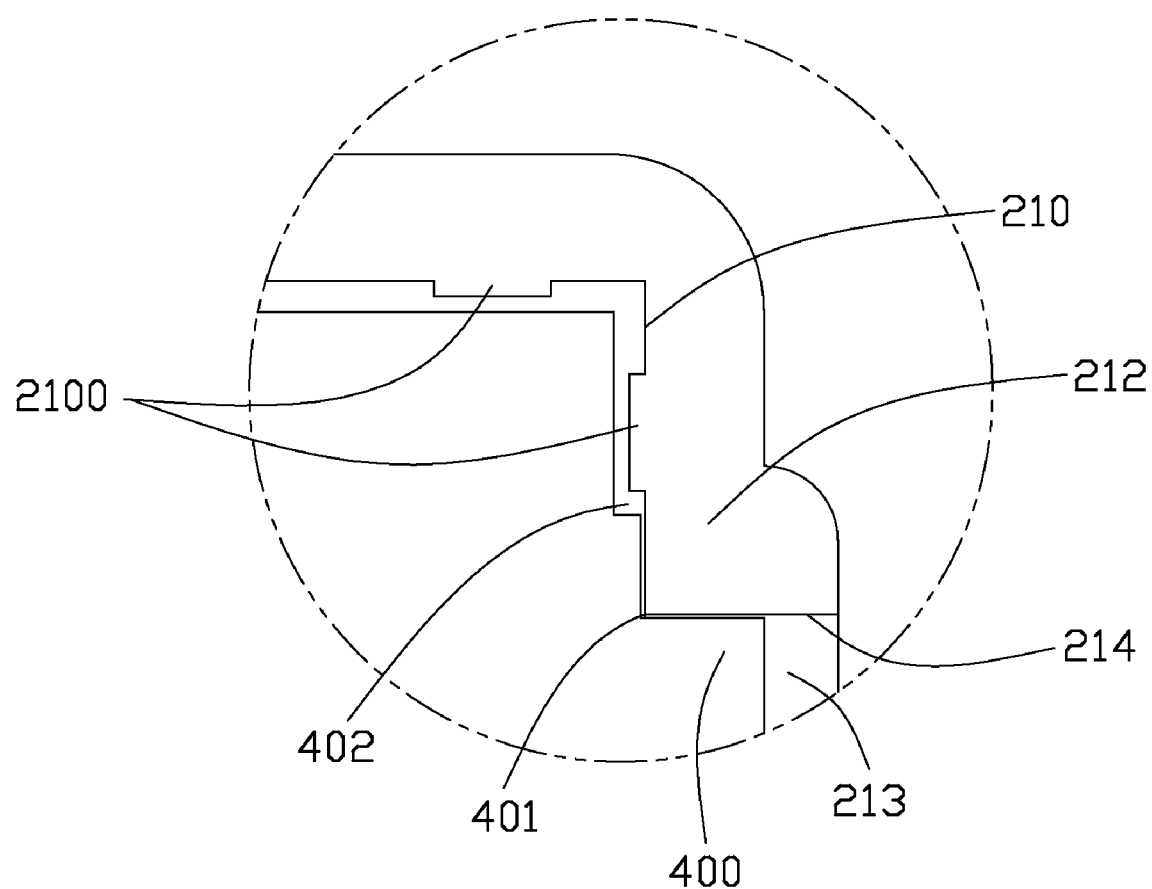
FIG. 7 is an enlarged view of a portion marked by a circle in FIG. 6.

Particularly referring to FIG. 2 and FIG. 3, the socket body 2 has a substantially rectangular configuration and includes a base section 20 and a plurality of side walls 21 extending upward from periphery of the base section 20. The base section 20 is formed with a plurality of receiving holes 200 therein for receiving the contacts 3 respectively. The side wall 21 includes an inner surface 210, an outer surface 211 and a top surface 212. Each inner surface 210 is formed with a pair of datum projections 2100 extending inwardly with a proper distance from the inner surface 210. One pair of opposite side walls 21 respectively has a carrying surface 213 formed by excavating the top surface 212. The carrying surface 213 is lower than the top surface 212 with a vertical distance therebetween and in the meantime, two inclined surfaces 214 at opposite ends of the carrying surface 213 are formed. The inclined surface 214 is perpendicular to the carrying surface 213, as well as the inner surface 210 of the side wall 21. The inner surface 210 and the inclined surface 214 jointly define a positioning angle 215 for positioning the pick-up cap 4. The inclined surface 214 is away from the datum projection 2100 with a selected distance therebetween. The carrying surface 213 has a slot 216 formed at a middle position thereof for taking and putting operation of the pick-up cap 4.

Particularly referring to FIG. 2 to FIG. 7, the pick-up cap 4 is mounted upon the socket body 2 and includes an elevated pick-up surface 41 and a mounting section 40 surrounding the pick-up surface 41. One pair of the opposite sides of the mounting section 40 is respectively formed with two carrying portion 400 at two ends thereof. The thickness of the carrying portion 400 is smaller than that of the mounting section 40. The carrying portion 400 is supported by the carrying surface 213 and positioned adjacent to the inclined surface 214 of the socket body 2. The carrying portion 400 defines a first notch 401 mating with the positioning angle 215 on the side wall 21 of the socket body 2 so as to assure the pick-up cap 4 is effectively positioned upon the socket body 2. In addition, a second notch 402 is defined beside the first notch 401 and is corresponding to the datum projection 2100 on the side wall 21 of the socket body 2. However, these is no substantial physical engagement between the datum projections 2100 and the pick-up cap 4. A pair of latching members 403 is respectively extending outwardly from the opposite sides of the mounting section 40 and is located between the two carrying portions 400. Each latching member 403 has a pair of hooks 404 engaging with the socket body 2 so as to prevent the pick-up cap 4 from being freely detached away from the socket body 2. The other pair of opposite sides of the mounting section 40 is respectively formed with a pair of recesses 405, and corresponding side wall 21 of the socket body 2 is mounted with a positioning member 5 having a pair of projecting portions 50 for engaging with the recess 405.

As described above, in the preferred embodiment of the present invention, the pick-up cap 4 could be positioned upon the socket body 2 by the engagement between the carry surface 213 of the socket body 2 and the carrying portion 400 of the pick-up cap 4 while without engagement with the datum projections 2100. Besides, the engagement between the positioning angle 215 defined by the socket body 2 and the first notch 401 defined by the pick-up cap 4 also promotes the positioning performance for the pick-up cap 4.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An IC socket for receiving an IC package comprising:
   a socket body having a base section and a plurality of side walls extending upward from the base section, at least one side wall defining a top surface, an inner surface, an outer surface and a pair of datum projections extending inwardly from the inner surface;
   a plurality of contacts received in the socket body; and
   a pick-up cap mounted upon the socket body;
   wherein the side wall with the datum projections comprises a carrying surface and an inclined surface which are formed by excavating the top surface, the carrying surface being lower than the top surface for engaging with a carrying portion formed on the pick-up cap, the inclined surface being away from the datum projection with a selected distance therebetween;
   wherein the inner surface and the inclined surface jointly define a positioning angle, and the pick-up cap defines a first notch that mating with the positioning angle, the positioning angle and the first notch being both right-angle configured; wherein the pick-up cap further defines a second notch corresponding to the datum projection.

2. The IC socket as claimed in claim 1, wherein the carrying surface and the inclined surface are perpendicular to one another.

3. The IC socket as claimed in claim 1, wherein the pick-up cap includes a pick-up surface at a middle position thereof and a mounting section at a periphery position thereof, the carrying portion being extending from the mounting section.

4. The IC socket as claimed in claim 1, wherein the pick-up surface is spaced from the mounting section with a selected distance along a vertical direction.

5. The IC socket as claimed in claim 1, wherein one pair of opposite sides of the pick-up cap respectively has two said carrying portion, between which a latching member is provided to have a hook engaging with the socket body.

6. The IC socket as claimed in claim 5, wherein the other pair of opposite sides of the pick-up cap respectively has a recess, and the socket body has a positioning member mounted thereon for engaging with the recess.

7. The IC socket as claimed in claim 1, wherein the carrying surface has a slot formed at a middle position therefrom for taking and putting operation of the pick-up cap.

8. The IC socket as claimed in claim 1, wherein each sidewall has two said datum projections symmetrically distributed thereon.

9. An IC socket for receiving an IC package comprising:
   a socket body having a base section and a plurality of side walls extending upward from the base section, at least one side wall defining a top surface, an inner surface and an outer surface;
   a plurality of contacts received in the socket body; and
   a pick-up cap positioned on the socket body and comprising an elevated pick-up surface and a mounting section around the pick-up surface;
   wherein the socket body has a carrying surface recessed from the side wall with a proper distance from the top surface, and the mounting section has a carrying portion supported by the carrying surface;
   wherein the side wall has an inclined surface adjacent and perpendicular to the carrying surface; wherein the side wall has a pair of datum projections away from corresponding inclined surface with a selected distance therebetween, respectively; wherein the inner surface and the inclined surface jointly define a positioning angle, and the pick-up cap is positioned by defining a first notch that mating with the positioning angle without engagement with the datum projections; wherein the pick-up cap further defines a second notch corresponding to the datum projection.

10. The IC socket as claimed in claim 9, wherein the positioning angle and the first notch are both right-angle configured.

\* \* \* \* \*